United States Patent
Chien et al.

(10) Patent No.: US 7,037,793 B2
(45) Date of Patent: May 2, 2006

(54) METHOD OF FORMING A TRANSISTOR USING SELECTIVE EPITAXIAL GROWTH

(75) Inventors: Chin-Cheng Chien, Hsin-Chu (TW); Ya-Lun Cheng, Taipei (TW); Yu-Kun Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 139 days.

(21) Appl. No.: 10/708,128

(22) Filed: Feb. 9, 2004

(65) Prior Publication Data
US 2005/0176205 A1    Aug. 11, 2005

(51) Int. Cl.
*H01L 21/336* (2006.01)
*H01L 21/332* (2006.01)

(52) U.S. Cl. .............. 438/300; 438/303; 438/756; 134/3

(58) Field of Classification Search ............ 438/299, 438/300, 301, 302, 303, 756, 770; 134/2, 134/3, 902
See application file for complete search history.

(56) References Cited

U.S. PATENT DOCUMENTS

| | | | |
|---|---|---|---|
| 6,580,134 B1 * | 6/2003 | Song et al. | 257/384 |
| 6,638,365 B1 * | 10/2003 | Ye et al. | 134/26 |
| 6,878,575 B1 * | 4/2005 | Yoo et al. | 438/142 |
| 2002/0146888 A1 * | 10/2002 | Ryu et al. | 438/300 |
| 2005/0093075 A1 * | 5/2005 | Bentum et al. | 257/368 |

* cited by examiner

*Primary Examiner*—Michael Lebentritt
(74) *Attorney, Agent, or Firm*—Winston Hsu (57) ABSTRACT

A method of forming a transistor involves firstly forming at least one gate structure on a semiconductor substrate. Then, a surface cleaning process is performed. In the surface cleaning process, a chemical oxidation method is utilized for forming a first oxide layer on a surface of the semiconductor substrate not covered with the gate structure and the first oxide layer is removed subsequently. Finally, a selective epitaxial growth method is utilized for forming a first epitaxial layer on the surface of the semiconductor substrate.

15 Claims, 11 Drawing Sheets

METHOD OF FORMING A TRANSISTOR USING SELECTIVE EPITAXIAL GROWTH

BACKGROUND OF INVENTION

1. Field of the Invention

The present invention relates to a method of forming a transistor using selective epitaxial growth (SEG), and more specifically, to a method of forming a transistor having a raised source/drain using selective epitaxial growth.

2. Description of the Prior Art

The selective epitaxial growth technology is widely applied in manufacturing a lot of kinds of semiconductor devices, such as a metal oxide semiconductor (MOS) transistor having a raised source/drain. The selective epitaxial growth technology is used to form an epitaxial layer on a single-crystalline substrate, and a crystalline orientation of the epitaxial layer is almost the same as that of the substrate. Additionally, before the epitaxial layer is deposited on the substrate, a surface cleaning process must be performed to remove native oxides and other impurities from a surface of the substrate so that the epitaxial layer of a good quality can be obtained. Accordingly, the surface cleaning process plays an important role in the selective epitaxial growth technology.

Figure 1:
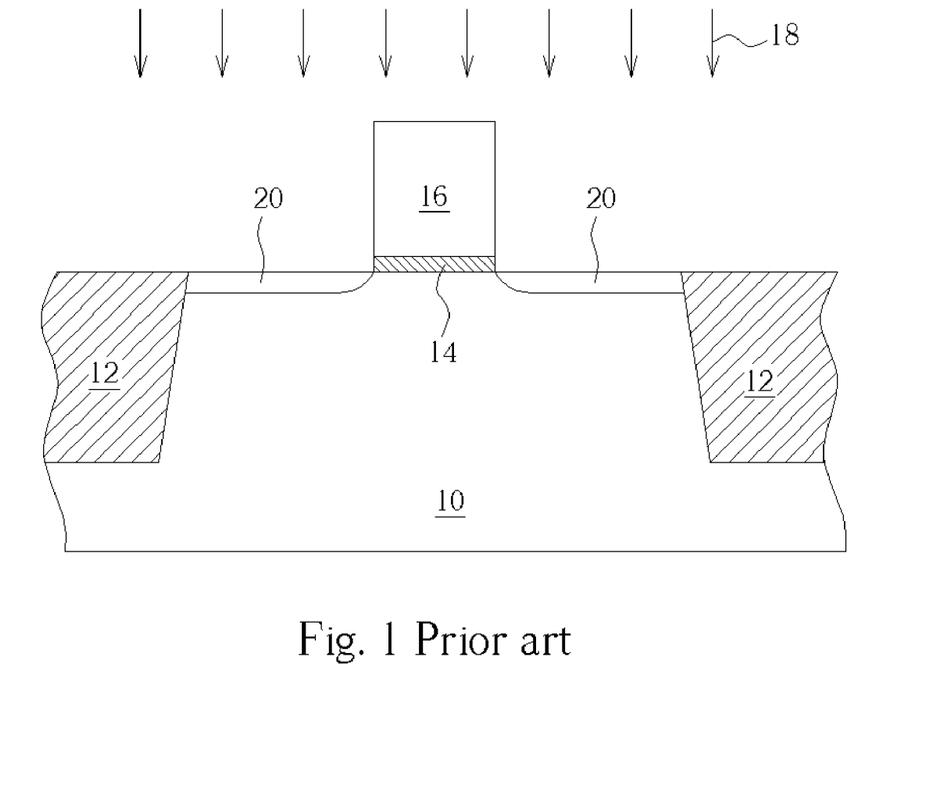
FIG. 1 to FIG. 4 are schematic diagrams illustrating a prior art method of forming a transistor using selective epitaxial growth.

Please refer to FIG. 1 to FIG. 4. FIG. 1 to FIG. 4 are schematic diagrams illustrating a prior art method of forming a transistor using selective epitaxial growth. As shown in FIG. 1, a plurality of shallow trench isolations (STIs) 12 is formed in a silicon substrate 10. Then, a gate oxide layer 14 is formed on a portion of the silicon substrate 10 and a gate electrode 16 is formed on the gate oxide layer 14. Usually, the gate oxide layer 14 and the gate electrode 16 comprise silicon dioxide ($SiO_2$) and doped polysilicon respectively. Thereafter, the gate electrode 16 is used as a mask layer and a first ion implantation process is performed to implant low dosage of dopants 18 into the silicon substrate 10, thereby forming source/drain extensions 20 in the silicon substrate 10 adjacent to both sidewalls of the gate electrode 16.

Figure 2:
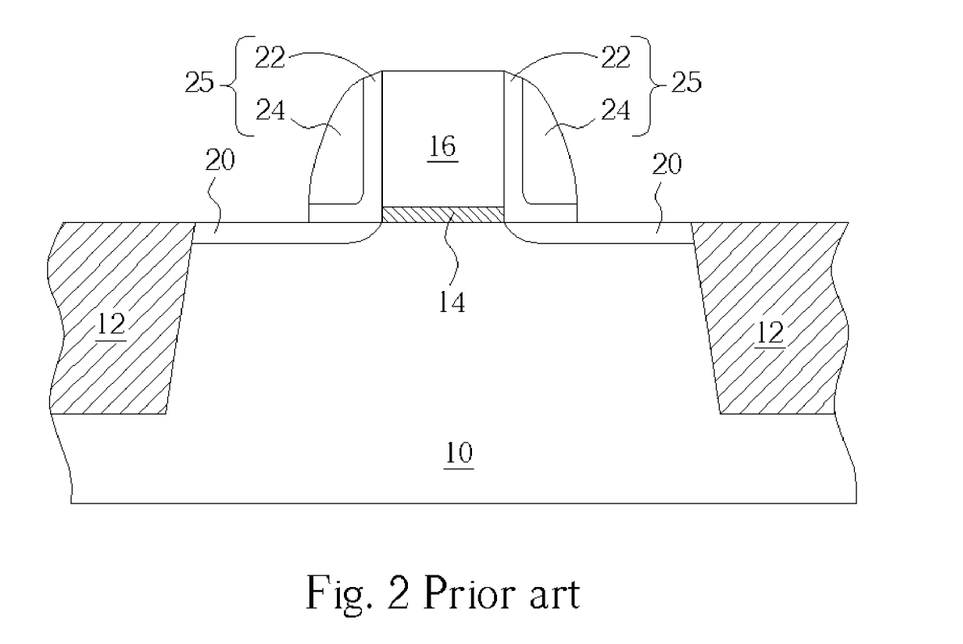

As shown in FIG. 2, a silicon dioxide layer 22 is formed on a surface of the silicon substrate 10 and covers the gate electrode 16. Then, a silicon nitride layer 24 is formed on the silicon dioxide layer 22. Subsequently, an etching-back process is performed on the silicon nitride layer 24 and the silicon dioxide layer 22 to form a spacer 25 on each sidewall of the gate electrode 16.

Figure 3:
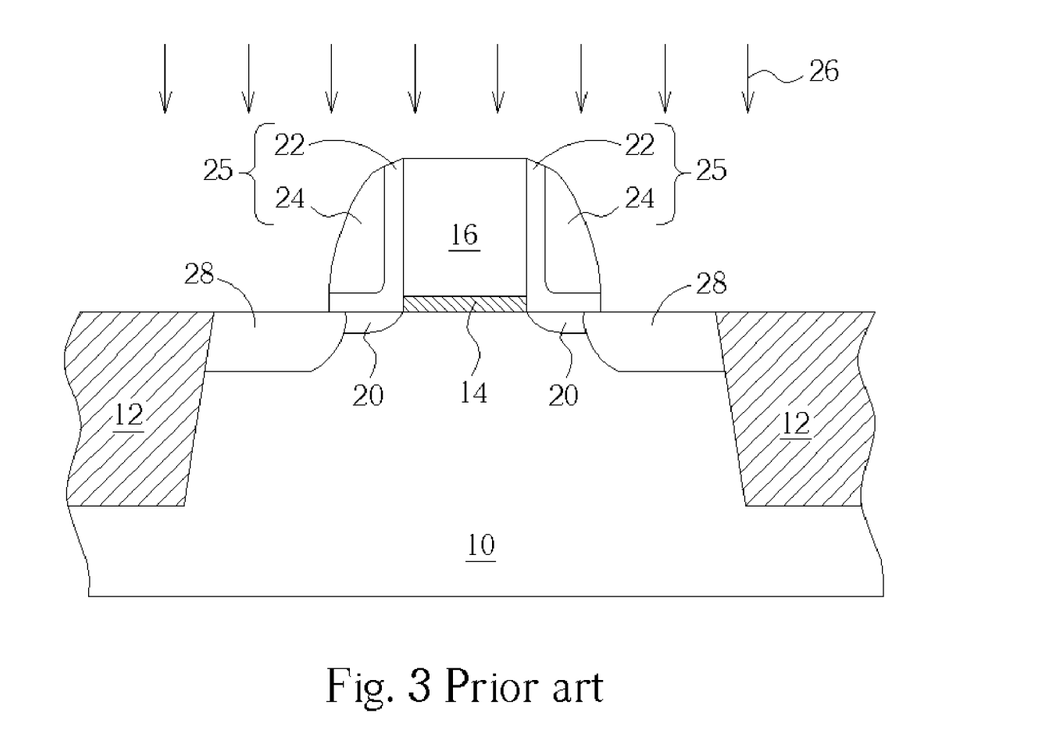

As shown in FIG. 3, the gate electrode 16 and the spacer 25 together function as a mask layer, and a second ion implantation process is performed to implant high dosage of dopants 26 into the silicon substrate 10, thus forming shallow source/drain 28 in the silicon substrate 10. Following that, a thermal annealing process is performed to activate the dopants in the silicon substrate 10 and repair the crystalline defects of the silicon substrate 10 that are formed while the above-mentioned ion implantation processes are performed. Usually, a temperature of the thermal annealing process ranges from 1000° C. to 1050° C.

Figure 4:
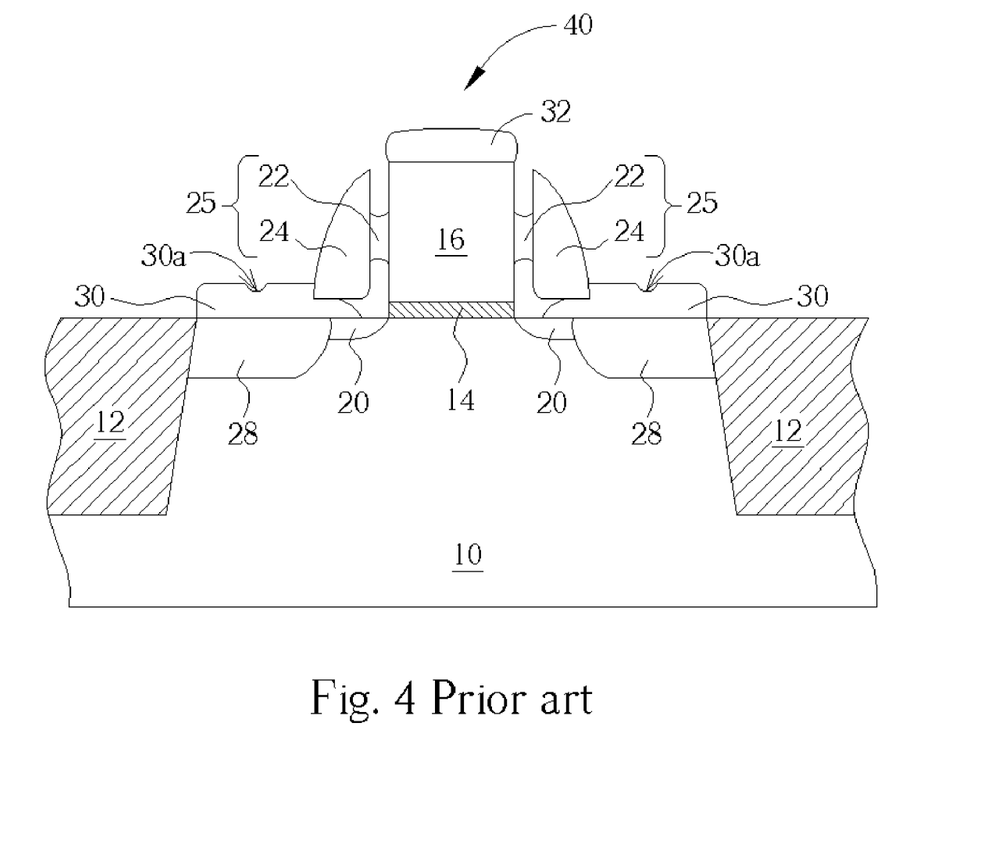

As shown in FIG. 4, a surface cleaning process is performed to dip the silicon substrate 10 into a hydrofluoric (HF) acid that removes native oxides and other impurities from the surface of the silicon substrate 10. Then, a hydrogen-baking step is performed to bake the silicon substrate 10 for about 2 minutes in the hydrogen ambience and at a temperature higher than 850° C. The high-temperature hydrogen can react with native oxides and impurities that are not removed by the surface cleaning process for cleaning the surface of the silicon substrate 10 again. Thereafter, a selective epitaxial growth process is performed to deposit a silicon epitaxial layer 30 on each source/drain 28 and form a silicon epitaxial layer 32 on a top surface of the gate electrode 16, thereby completing the manufacture of the transistor 40. Additionally, the silicon epitaxial layers 30 are used as a raised source/drain of the transistor 40.

Figure 5:
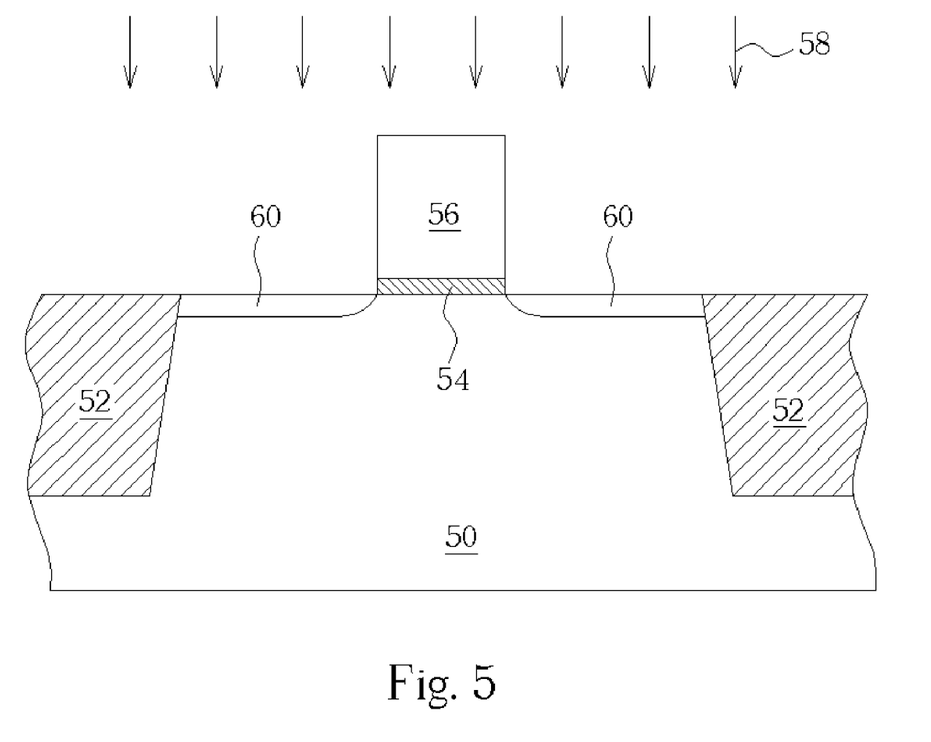
FIG. 5 to FIG. 11 are schematic diagrams illustrating a method of forming a transistor using selective epitaxial growth according to the present invention.

It should be noted that the etching-back process for forming the spacer 25 usually leaves several impurities, such as carbon atoms, fluorine atoms, hydrogen atoms, and so on, on the surface of the silicon substrate 10. The carbon atoms among the impurities always lead to forming pits 30a in the silicon epitaxial layers 30, and more seriously, the impurities may cause that the silicon epitaxial layers 30 cannot be formed on the silicon substrate 10. However, the prior art surface cleaning process cannot remove carbon, fluorine, and hydrogen atoms effectively, so that the silicon epitaxial layers 30 always contain pits 30a and the quality of the silicon epitaxial layers 30 is usually poor. Furthermore, since the prior art surface cleaning process cannot remove the impurities from the silicon substrate 10 completely, the temperature and the processing time of the hydrogen-baking step have to be increased in order to remove the impurities. However, for the transistor 40 having the ultra shallow source/drain 28, increasing the temperature and the processing time of the hydrogen-baking step will make the shallow source/drain 28 over-diffuse, thereby increasing leakage currents of the transistor 40 and reducing electrical performance of the transistor 40. Moreover, as shown in FIG. 4 and FIG. 5, the hydrofluoric acid always erodes the silicon oxide layer 22 to form an undercut on a bottom of the spacer 25, which leads to leakage currents of the transistor 40.

SUMMARY OF INVENTION

It is therefore one object of the claimed invention to provide a method of forming a transistor having a raised source/drain using selective epitaxial growth to solve the above-mentioned problem.

According to the claimed invention, a method of forming a transistor on a semiconductor substrate is provided. Firstly, at least one gate structure is formed on a semiconductor substrate. Then, a surface cleaning process is performed. In the surface cleaning process, a chemical oxidation method is utilized for forming a first oxide layer on a surface of the semiconductor substrate not covered with the gate structure and the first oxide layer is removed subsequently. Finally, a selective epitaxial growth method is utilized for forming a first epitaxial layer on the surface of the semiconductor substrate.

It is an advantage over the prior art that the claimed invention firstly utilizes the chemical oxidation process to oxidize portions of the semiconductor substrate containing impurities to form the first oxide layer that is removed sequentially. Since the first oxide layer containing the impurities are removed, the present invention makes the semiconductor substrate have an impurity-free surface, thereby forming the first silicon epitaxial layer of a good quality in the selective epitaxial growth process.

These and other objects of the present invention will be apparent to those of ordinary skill in the art after having read the following detailed description of the preferred embodiment that is illustrated in the various figures and drawings.

DETAILED DESCRIPTION

Please refer to FIG. 5 to FIG. 11. FIG. 5 to FIG. 11 are schematic diagrams illustrating a method of forming a transistor using selective epitaxial growth according to the present invention. As shown in FIG. 5, a silicon substrate 50 is firstly provided and a plurality of shallow trench isolations (STIs) 52 is formed in the silicon substrate 50. Then, a gate oxide layer 54 is formed on a portion of the silicon substrate 50, and a gate electrode 56 is formed over the gate oxide layer 54. Usually, the gate oxide layer 54 and the gate electrode 56 comprise silicon dioxide and doped polysilicon respectively. Thereafter, an offset spacer (not shown) composed of silicon dioxide can be optionally formed on each sidewall of the gate electrode 56. Subsequently, the gate electrode 56 is used as a mask layer, and a first ion implantation process is performed to implant low dosage of dopants 58 into the silicon substrate 50, thereby forming source/drain extensions 60 in the silicon substrate 50 adjacent to both sidewalls of the gate electrode 56.

Figure 6:
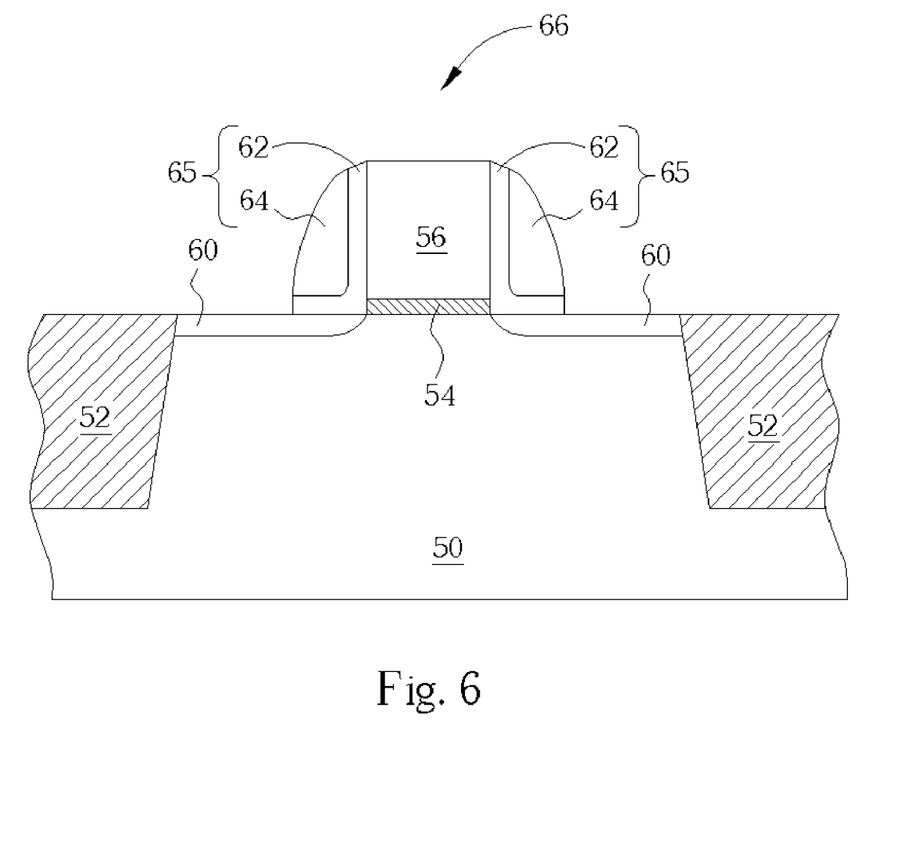

As shown in FIG. 6, a liner oxide layer 62 is uniformly formed on a surface of the silicon substrate 50 and covers the gate electrode 56 through using a thermal oxidation process or a chemical vapor deposition (CVD) process. Then, a dielectric layer 64 is formed on the liner oxide layer 62 through performing a chemical vapor deposition process. Thereafter, an etching-back process is performed on the dielectric layer 64 and the liner oxide layer 62 to form a spacer 65 on each sidewall of the gate electrode 56. The gate oxide layer 54, the gate electrode 56, and the spacer 65 constitute a gate structure 66. Additionally, the liner oxide layer 62 and the dielectric layer 64 respectively comprise silicon dioxide and silicon nitride, and the liner oxide layer 62 functions as a thermal stress buffer layer of the silicon nitride layer 64.

Figure 7:
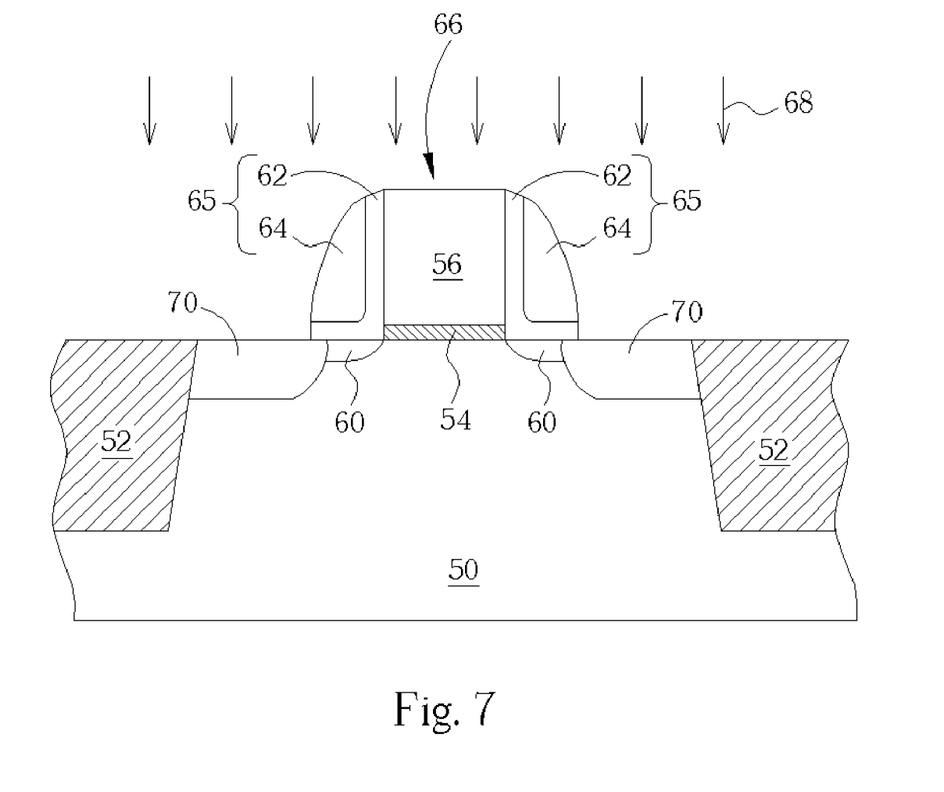

As shown in FIG. 7, the gate structure 66 is used as a mask layer, and a second ion implantation process is performed to implant high dosage of dopants 68 into the silicon substrate 50, thereby forming a shallow source/drain 70 in the silicon substrate 50 adjacent to both sidewalls of the gate structure 66. Then, a third ion implantation process may be optionally performed to form two pocket-doping regions (not shown) respectively connected to the shallow source/drain 70. Subsequently, a thermal annealing process, such as a spike rapid thermal annealing (RTA) or a laser annealing process, is performed to activate the dopants of the source/drain extensions 60 and shallow source/drain 70, and to repair the crystalline defects of the silicon substrate 50 that are formed when the ion implantation processes are performed.

Figure 8:
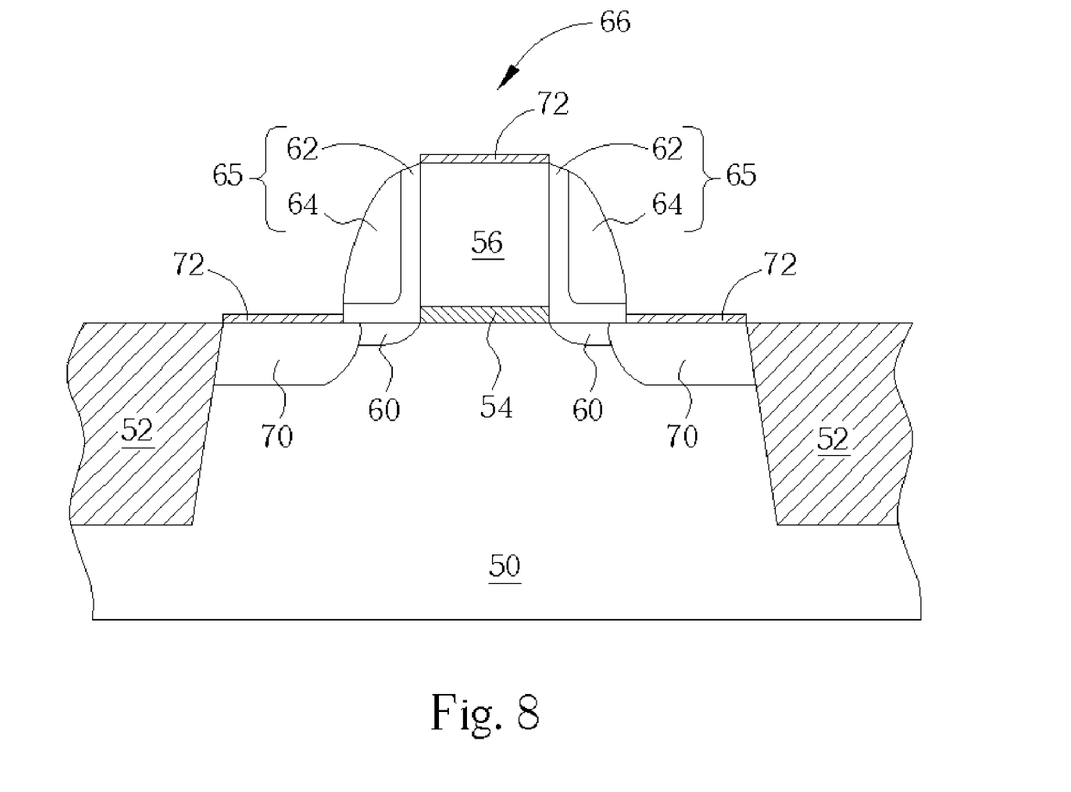
Figure 9:
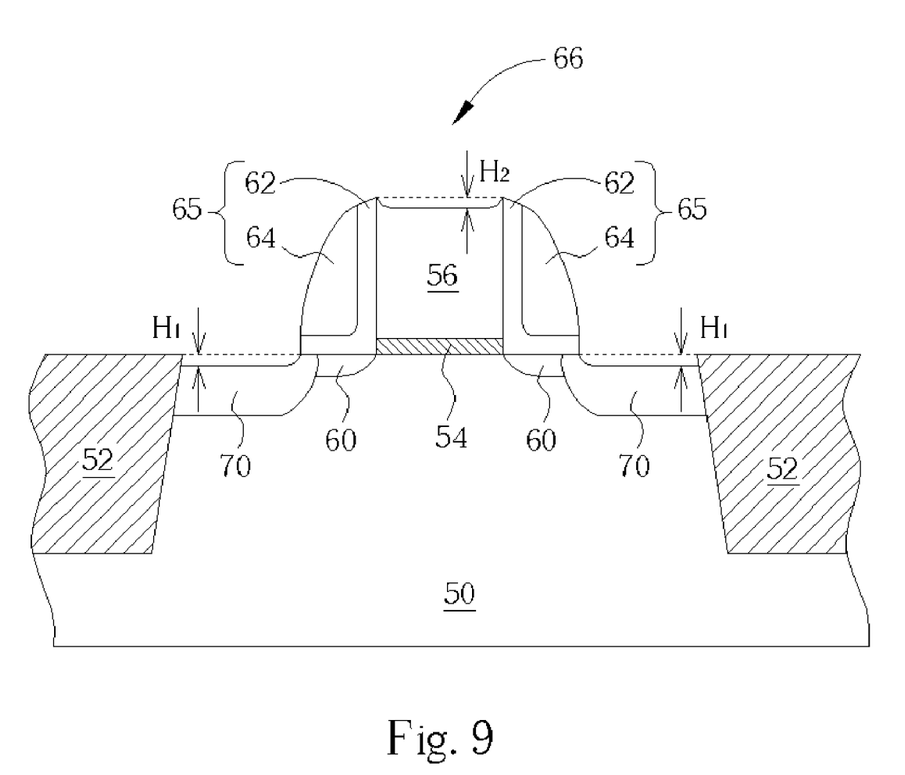

As shown in FIG. 8 and FIG. 9, a surface cleaning process is performed repeatedly for several times in order to remove a thickness $H_1$ of the silicon substrate 50 and remove a thickness $H_2$ of the gate electrode 56, thereby removing native oxides and impurities from the silicon substrate 50 and the gate electrode 56. Noticeably, the thickness $H_1$ is approximately equal to a total thickness of the native oxides and the impurities of the silicon substrate 50, and the thickness $H_2$ is approximately the same as a total thickness of the native oxides and the impurities of the gate electrode 56. Accordingly, the frequencies for performing the surface cleaning process depend on the thickness of the native oxides and the impurities of the silicon substrate 50 and the gate electrode 56. In the present embodiment, the surface cleaning process is performed for three or four times. Additionally, the thickness $H_1$ and the thickness $H_2$ both usually range from 10 Å to 50 Å, and the preferred value is about 30 Å.

In the surface cleaning process of the present invention, a chemical oxidation process is firstly performed to use an oxidant acid to simultaneously oxidize a top surface of the gate electrode 56 and surfaces of the shallow source/drain 70, thereby forming oxide layers 72 respectively on the top surface of the gate electrode 56 and on the surfaces of the shallow source/drain 70, as shown in FIG. 8. Additionally, a thickness of each oxide layer 72 is between 15 Å and 30 Å. Then, the silicon substrate 50 is dipped into a diluted hydrofluoric acid (DHF) that removes the oxide layers 72 form the silicon substrate 50, as shown in FIG. 9. As described above, the etching-back process for forming the spacer 65 usually leaves several impurities, such as carbon, fluorine, and hydrogen atoms, on the surface of the silicon substrate 50. Accordingly, the present invention oxidizes portions of the silicon substrate 50 containing the native oxides and the impurities to form the oxide layers 72, and then, the oxide layers 72 are removed through using the diluted hydrofluoric acid. That is to say, the portions of the silicon substrate 50 containing the impurities, such as carbon, fluorine, and hydrogen atoms, are transformed into the oxide layers 72. Therefore, when the oxide layers 72 are removed through using the diluted hydrofluoric acid, the impurities are totally removed from the silicon substrate 50. Similarly, the surface cleaning process of the present invention also removes the impurities from the top surface of the gate electrode 56. In the preferred embodiment of the present invention, the oxidant acid used in the surface cleaning process is a sulfuric acid-hydrogen peroxide-water mixture (SPM), which is a mixture comprising sulfuric acid ($H_2SO_4$), hydrogen peroxide ($H_2O_2$), and deionized water. Additionally, a volume ratio of sulfuric acid to hydrogen peroxide is approximately 4 to 1, and a temperature of the SPM is about 125° C. In another embodiment of the present invention, the oxidant acid used in the surface cleaning process is sulfuric acid-ozone-water mixture (SPM), which is a mixture comprising sulfuric acid ($H_2SO_4$), ozone ($O_3$), and deionized water. A temperature of the SPM is about 35° C.

Figure 10:
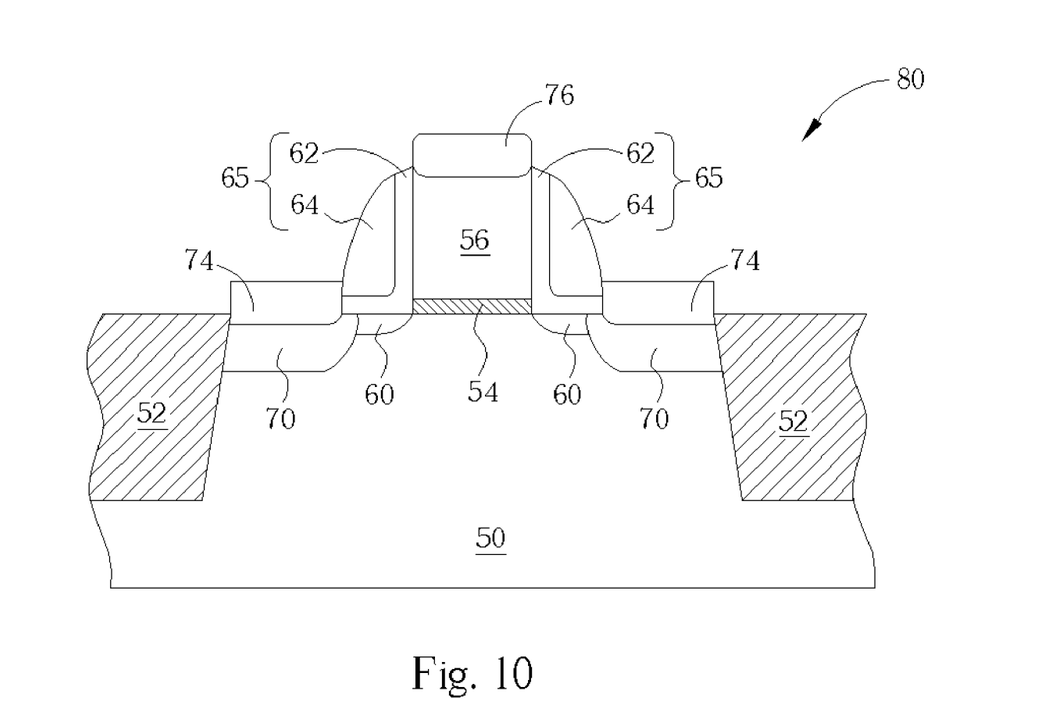

After the surface cleaning process is completed, the silicon substrate 50 is moved to a CVD chamber, as shown in FIG. 10. However, when the silicon substrate 50 is moved to a CVD chamber, several native oxides may be formed on the surface of the silicon substrate 50. Accordingly, a hydrogen-baking step is firstly performed in the CVD chamber to bake the silicon substrate 50 for about 1–2 minutes in a hydrogen ambience and at a temperature lower than 750° C. In the hydrogen-baking step, the high-temperature hydrogen gas reacts with the native oxides and removes the native oxides from the surface of the silicon substrate 50. Thereafter, a selective epitaxial growth process is performed in the CVD chamber to deposit a silicon epitaxial layer 74 on the silicon substrate 50 not covered by the gate structure 66. Simultaneously, the selective epitaxial growth process also forms a silicon epitaxial layer 76 on the top surface of the gate electrode 56, thereby completing the manufacture of the transistor 80. Additionally, the silicon epitaxial layers 74 are used as a raised source/drain of the transistor 80, and a thickness of the silicon epitaxial layer 74 approximately ranges from 200 Å to 300 Å. In the preferred embodiment of the present invention, the process gas used in the selective epitaxial growth process comprises dichlorosilane (DCS), HCl, and hydrogen, and the processing temperature is lower than 800° C. In another embodiment of the present invention, the process gas used in the selective epitaxial growth process comprises silane ($SiH_4$) and $Cl_2$.

Figure 11:
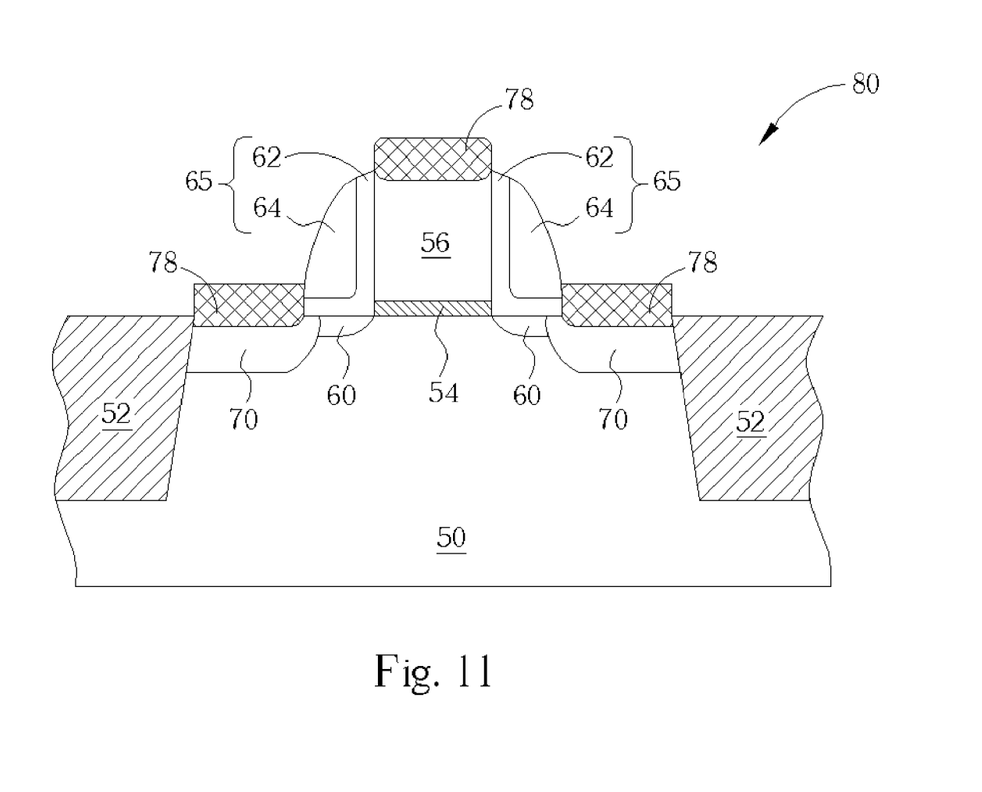

As shown in FIG. 11, a self-aligned suicide (salicide) process is performed. During the salicide process, a cobalt layer (not shown) whose thickness is about 100 Å is firstly deposited on the silicon substrate 50. Then, the cobalt layer reacts with the silicon epitaxial layers 74 and 76 to form silicide layers 78 through sequentially performing several thermal processes. After that, the cobalt layer that does not react with the silicon epitaxial layers 74 and 76 is removed through using a wet-etching process. Noticeably, since an interface between the silicon epitaxial layers 74 and the silicon substrate 50 may hinder electrons from moving, the cobalt layer preferably reacts with the whole silicon epitaxial layers 74 and 76 for eliminating the above-mentioned interface.

Additionally, the surface cleaning process and the selective epitaxial growth process of the present invention can be used to form other kinds of epitaxial layers, such as silicon germanium (SiGe), SiGeC, and so on. Furthermore, the surface cleaning process and the selective epitaxial growth process of the present invention also can be applied in manufacturing other semiconductor devices, such as SiGe—BiCMOS or shallow trench isolation. Moreover, the above-mentioned second ion implantation process can be performed after the selective epitaxial growth process is performed. That is to say, the silicon epitaxial layers 74 and 76 can firstly formed, and then, the second ion implantation process is performed to form the shallow source/drain 70 of the transistor 80.

In comparison with the prior art, the surface cleaning process of the present invention includes two steps: (a) using an oxidant acid to oxidize surfaces of the shallow source/drain 70 and the gate electrode 56 to form the oxide layers 72; and (b) using diluted hydrofluoric acid to remove the oxide layers 72. In the surface cleaning process, the portions of the silicon substrate 50 and the gate electrode 56 containing the native oxides and the impurities are oxidized to form oxide layers 72, and the oxide layers 72 are subsequently removed. Therefore, the native oxides and the impurities are completely removed from the silicon substrate 50 and the gate electrode 56. Because the silicon substrate 50 and the gate electrode 56 both have impurity-free surfaces, the silicon epitaxial layers 74 and 76 of a good quality can be formed in the selective epitaxial growth process. Additionally, since the native oxides and the impurities are completely removed from the silicon substrate 50 and the gate electrode 56 in the surface cleaning process, the present invention can reduce the temperature and the processing time of the hydrogen-baking step, thus preventing the shallow source/drain 60 from over-diffusing. Furthermore, the diluted hydrofluoric acid etches the oxide layers 72 formed by a chemical oxidation process much faster than it etches the liner oxide layer 62 formed by a thermal oxidation process or a chemical vapor deposition process. As a result, when the diluted hydrofluoric acid etches the oxide layers 72, the liner oxide layer 62 will not be damaged at all, thereby preventing leakage currents from being generated in the transistor 80 and improving the electrical performance of the transistor 80.

Those skilled in the art will readily observe that numerous modifications and alterations of the device may be made while retaining the teachings of the invention. Accordingly, the above disclosure should be construed as limited only by the metes and bound of the appended claims.

The invention claimed is:

1. A method of forming a transistor on a semiconductor substrate comprising:
   forming at least one gate structure on the semiconductor substrate;
   performing a surface cleaning process, the surface cleaning process comprising:
      utilizing a chemical oxidation method for forming a first oxide layer on a surface of the semiconductor substrate and a second oxide layer on a surface of the gate structure; and
      removing the first oxide layer and the second oxide layer simultaneously; and
   utilizing a selective epitaxial growth method for forming a first epitaxial layer on the surface of the semiconductor substrate.

2. The method of claim 1 further comprising performing the surface cleaning process repeatedly for removing a first thickness of the semiconductor substrate.

3. The method of claim 2 wherein the chemical oxidation method utilizes an oxidant acid to form the first oxide layer.

4. The method of claim 3 wherein the surface cleaning process utilizes a diluted hydrofluoric acid to remove the first oxide layer.

5. The method of claim 4 wherein the oxidant acid is a mixture comprising sulfuric acid ($H_2SO_4$), hydrogen peroxide ($H_2O_2$), and deionized water.

6. The method of claim 5 wherein a volume ratio of sulfuric acid to hydrogen peroxide is approximately 4 to 1, and a temperature of the oxidant acid is about 125° C.

7. The method of claim 4 wherein the oxidant acid is a mixture comprising sulfuric acid ($H_2SO_4$), ozone ($O_3$), and deionized water, and a temperature of the oxidant acid is about 35° C.

8. The method of claim 2 wherein a thickness of the first oxide layer approximately ranges from 15 angstroms (Å) to 30 angstroms, and the first thickness approximately ranges from 10 angstroms to 50 angstroms.

9. The method of claim 2 wherein forming the gate structure comprises the following steps:
   forming a gate oxide layer on a portion of the semiconductor substrate;
   forming a gate electrode on the gate oxide layer;
   forming a liner oxide layer on the semiconductor substrate to cover the gate electrode;
   forming a dielectric layer on the liner oxide layer; and
   performing an etching-back process on the liner oxide layer and the dielectric layer to form a spacer on sidewalls of the gate electrode;
   wherein the gate structure comprises the gate oxide layer, the gate electrode, and the spacer.

10. The method of claim 1 wherein the selective epitaxial growth method further comprises forming a second epitaxial layer on the surface of the gate electrode.

11. The method of claim 9 further comprising performing an ion-implantation process for forming a source electrode in the semiconductor substrate adjacent to one side of the gate structure and forming a drain electrode in the semiconductor substrate adjacent to another side of the gate structure.

12. The method of claim 11 wherein the ion-implantation process is performed before the surface cleaning process is performed.

13. The method of claim 11 wherein the ion-implantation process is performed after the first epitaxial layer is formed.

14. The method of claim 10 further comprising forming suicide layers on both the first epitaxial layer and the second epitaxial layer.

15. The method of claim 10 wherein the semiconductor substrate is a silicon substrate, and the first epitaxial layer and the second epitaxial layer are both silicon epitaxial layers.

* * * * *